(12) United States Patent
Arai et al.

(10) Patent No.: US 9,609,762 B2
(45) Date of Patent: Mar. 28, 2017

(54) FLUX, SOLDER COMPOSITION, AND METHOD FOR MANUFACTURING ELECTRONIC CIRCUIT MOUNTED SUBSTRATE

(71) Applicant: KOKI Company Limited, Tokyo (JP)

(72) Inventors: Kenji Arai, Tokyo (JP); Mitsuyasu Furusawa, Tokyo (JP); Junichi Aoki, Tokyo (JP); Mayumi Takada, Tokyo (JP); Munehiko Nakatsuma, Tokyo (JP)

(73) Assignee: KOKI Company Limited, Tokyo (JP)

( * ) Notice: Subject to any disclaimer, the term of this patent is extended or adjusted under 35 U.S.C. 154(b) by 146 days.

(21) Appl. No.: 14/384,204

(22) PCT Filed: Mar. 11, 2013

(86) PCT No.: PCT/JP2013/056660
§ 371 (c)(1),
(2) Date: Sep. 10, 2014

(87) PCT Pub. No.: WO2013/137200
PCT Pub. Date: Sep. 19, 2013

(65) Prior Publication Data
US 2015/0102090 A1    Apr. 16, 2015

(30) Foreign Application Priority Data

Mar. 12, 2012  (JP) .................. 2012-054833

(51) Int. Cl.
| | | |
|---|---|---|
| *B23K 31/00* | (2006.01) | |
| *B23K 31/02* | (2006.01) | |
| *B23K 35/34* | (2006.01) | |
| *H05K 3/34* | (2006.01) | |
| *B23K 35/36* | (2006.01) | |
| *B23K 35/362* | (2006.01) | |
| *H05K 13/04* | (2006.01) | |
| *H05K 1/03* | (2006.01) | |

(52) U.S. Cl.
CPC ........... *H05K 3/3489* (2013.01); *B23K 35/36* (2013.01); *B23K 35/362* (2013.01); *B23K 35/3612* (2013.01); *B23K 35/3613* (2013.01); *B23K 35/3618* (2013.01); *H05K 13/0465* (2013.01); *H05K 1/0346* (2013.01)

(58) Field of Classification Search
CPC ................ B23K 35/3612; B23K 35/36; B23K 35/3613; B23K 35/3618; B23K 35/362; H05K 3/3489
USPC ...... 148/23, 25; 257/E21.503, E23.119, 737; 228/180.22
See application file for complete search history.

(56) References Cited

U.S. PATENT DOCUMENTS

| | | |
|---|---|---|
| 6,075,080 A | 6/2000 | Katsuoka et al. |
| 2002/0017337 A1 | 2/2002 | Arora et al. |
| 2006/0134901 A1 | 6/2006 | Chaware et al. |
| 2006/0272747 A1 | 12/2006 | Wang et al. |
| 2008/0023108 A1 | 1/2008 | Wang et al. |
| 2008/0053572 A1 | 3/2008 | Sanji et al. |
| 2010/0313416 A1 | 12/2010 | Meura |
| 2011/0037174 A1 | 2/2011 | Nikaido et al. |

FOREIGN PATENT DOCUMENTS

| | | |
|---|---|---|
| CN | 1429143 A | 7/2003 |
| CN | 1808692 A | 7/2006 |
| CN | 1880008 A | 12/2006 |
| CN | 101960932 A | 1/2011 |
| CN | 102027584 A | 4/2011 |
| CN | 102049631 A | 5/2011 |
| JP | 924488 A | 1/1997 |
| JP | 1177377 A | 3/1999 |
| JP | 11179589 A | 7/1999 |
| JP | 200052088 A | 2/2000 |
| JP | 2001150184 A | 6/2001 |
| JP | 2002069138 A | 3/2002 |
| JP | 2003347718 A | 12/2003 |
| JP | 2004138752 A | 5/2004 |
| JP | 2004152936 A | 5/2004 |
| JP | 2004230426 A | 8/2004 |
| JP | 2004277518 A | 10/2004 |
| JP | 2007222932 A | 9/2007 |
| JP | 200862252 A | 3/2008 |

*Primary Examiner* — Erin Saad
(74) *Attorney, Agent, or Firm* — The Webb Law Firm

(57) ABSTRACT

Provided is a flux that includes at least one polybutadiene (meth)acrylate compound selected from polybutadiene (meth)acrylate compounds and polybutadiene (meth)acrylate compounds, and a hydrogenated dimer acid.

14 Claims, No Drawings

FLUX, SOLDER COMPOSITION, AND METHOD FOR MANUFACTURING ELECTRONIC CIRCUIT MOUNTED SUBSTRATE

CROSS-REFERENCE TO RELATED APPLICATIONS

This application is the United States national phase of International Application No. PCT/JP2013/056660 filed Mar. 11, 2013, and claims priority to Japanese Patent Application No. 2012-054833 filed Mar. 12, 2012, the disclosures of which are hereby incorporated in their entirety by reference.

TECHNICAL FIELD

The present invention relates to a flux used to solder electronic components, a solder composition, and a method for manufacturing an electronic circuit mounted substrate that uses such a solder composition.

BACKGROUND ART

Solder compositions such as a so-called solder paste formed from a mixture of a solder alloy powder and a flux, and a so-called resin flux cored solder in which a flux is filled inside a wire-shaped solder alloy, for example, are used for mounting electronic components on an electronic circuit substrate, such as a printed circuit substrate. As the flux used in such solders, generally resin fluxes including a synthetic resin, a rosin resin, or the like as a resin component are widely used.

The above-described flux is blended in a solder composition and the like in order to improve solderability by removing metal oxides on a surface conductive portion of the printed circuit substrate, preventing the solder alloy from reoxidizing during soldering, or reducing the surface tension of the solder.

On the other hand, when soldering using a solder that uses the above-described flux, a film portion referred to as flux residue resulting from the resin component in the flux remains on the electronic circuit mounted substrate after the soldering. This flux residue can contain fissures (cracks) caused by temperature changes during the thermal cycle and the like. If moisture seeps into the flux residue from the cracks, this can cause defects such as a deterioration in the insulation between leads.

Especially, in an electronic circuit mounted substrate that is used in an area subjected to large temperature differences, such as an electronic circuit mounted substrate used in the engine of an automobile and the like, cracks tend to occur in the above-described flux residue, and the occurrence of these cracks needs to be suppressed.

Various technologies exist for suppressing such cracks.

For example, Patent Literature 1 and Patent Literature 2 describe a flux that includes an acrylic resin having a low glass transition temperature.

Patent Literature 3 describes a flux that includes hydrogenated 1,2-polybutadiene and the like as a resin component.

Patent Literature 4 describes a flux that includes a polyamide resin having a softening point of 80 to 150° C. that is obtained by a condensation reaction of a dimer acid and a diamine.

Patent Literature 5 describes a flux that, in addition to including rosin and an activator, also includes an ethylene vinyl acetate copolymer.

Patent Literature 6 describes a flux that includes as a resin component a compound in which acrylic groups or methacrylic groups are bonded to the molecular end of atactic 1,2-polybutadiene or a hydride thereof.

However, the fluxes described in Patent Literatures 1 and 2 suffer from the following problem: the flux residue is sticky and contamination from dust and the like tends to occur. The fluxes described in Patent Literatures 3 to 6 suffer from the following problem: although a certain level of solder wettability can be obtained under low-temperature preheating conditions of 160° C. or less, under the high-temperature preheating conditions of more than 160° C. that are required for lead-free solder and the like, sufficient solder wettability is not obtained, and dewetting can occur.

In addition, the fluxes described in Patent Literatures 1 to 6 all suffer from the following problem: since solder wettability cannot be sufficiently exhibited under reflow heating in an air atmosphere, only reflow in a nitrogen atmosphere can be carried out.

CITATION LIST

Patent Literature

Patent Literature 1: Japanese Patent Laid-Open No. 2001-150184

Patent Literature 2: Japanese Patent Laid-Open No. 2008-62252

Patent Literature 3: Japanese Patent Laid-Open No. Hei-09-24488

Patent Literature 4: Japanese Patent Laid-Open No. Hei-11-77377

Patent Literature 5: Japanese Patent Laid-Open No. 2000-52088

Patent Literature 6: Japanese Patent Laid-Open No. Hei-11-179589

SUMMARY OF INVENTION

Technical Problem

It is an object of the present invention, which was created in view of problems in the conventional art such as those described above, to provide a flux that is capable of suppressing the occurrence of cracking in flux residue, and that has good solder wettability even under high-temperature soldering, a solder composition, and a method for manufacturing an electronic circuit mounted substrate.

Solution to Problem

A flux according to the present invention includes:

at least one polybutadiene (meth)acrylate compound selected from the group consisting of polybutadiene (meth)acrylate compounds represented by the following formula 1 and polybutadiene (meth)acrylate compounds represented by the following formula 2, and a hydrogenated dimer acid.

[Formula 1]

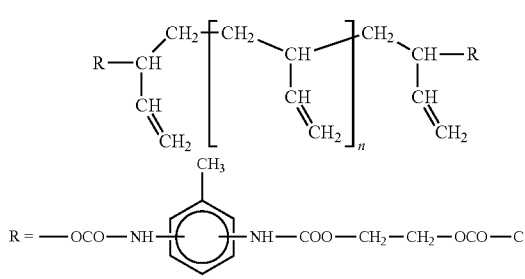

(R') = CH$_2$
R' = ——H, or ——CH$_3$

[Formula 2]

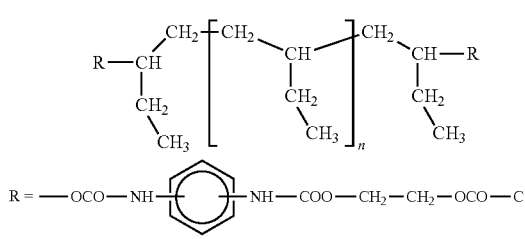

(R') = CH$_2$
R' = ——H, or ——CH$_3$

In the present invention, the above-described dimer acid may be at least one dimer acid selected from the group consisting of dimer acids represented by the following formula 3 and dimer acids represented by the following formula 4.

[Formula 3]

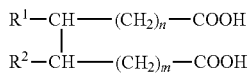

wherein $R^1$ and $R^2$ represent the same or different alkyl groups, and the total number of carbon atoms in the formula is 36.

[Formula 4]

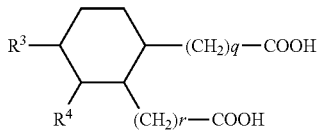

wherein $R^3$ and $R^4$ represent the same or different alkyl groups, and the total number of carbon atoms in the formula is 36.

The present invention may include at least one rosin resin selected from the group consisting of rosin, hydrogenated rosin, polymerized rosin, disproportionated rosin, and acrylic acid-modified rosin.

The present invention includes at least one of the above-described fluxes.

The present invention may include a lead-free solder alloy.

A method for manufacturing an electronic circuit mounted substrate according to the present invention includes:

forming a solder printing pattern by printing a solder composition;

mounting an electronic component on the solder printing pattern; and preheating an electronic circuit substrate on which the electronic component is mounted in an air atmosphere at 150° C. or more and 200° C. or less, and then performing reflow for main heating.

DESCRIPTION OF EMBODIMENTS

The flux, the solder composition, and the method for manufacturing an electronic circuit mounted substrate according to the present invention will now be described below.

First, the flux according to the present embodiment includes at least one polybutadiene (meth)acrylate compound selected from the group consisting of polybutadiene (meth)acrylate compounds represented by the following formula 5 and polybutadiene (meth)acrylate compounds represented by the following formula 6, and a hydrogenated dimer acid.

[Formula 5]

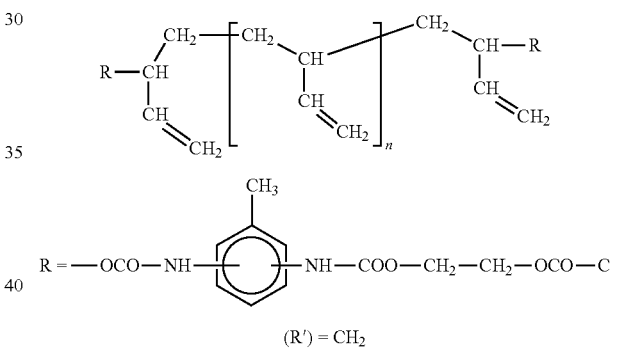

(R') = CH$_2$
R' = ——H, or ——CH$_3$

[Formula 6]

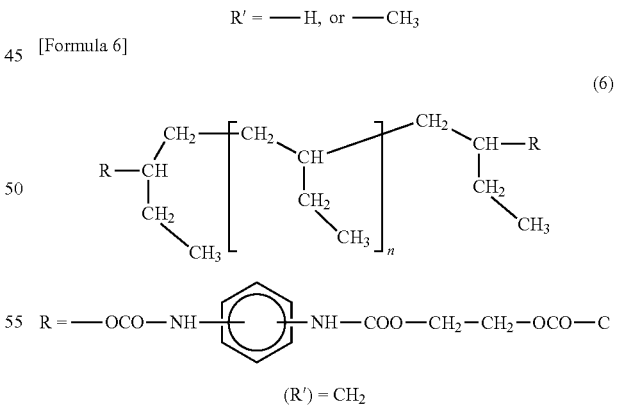

(R') = CH$_2$
R' = ——H, or ——CH$_3$

Examples of the polybutadiene (meth)acrylate compound represented by the above formula 5 include trade name "NISSO-PB TEA-1000" manufactured by Nippon Soda, CO., Ltd.

The polybutadiene (meth)acrylate compound represented by the above formula 6 is a saturated polybutadiene (meth)

acrylate compound in which hydrogens have been added to the unsaturated moieties of the polybutadiene of the polybutadiene (meth)acrylate compound represented by the above formula 5.

Examples of the polybutadiene (meth)acrylate compound represented by the above formula 6 include trade name "NISSO-PB TEAI-1000" manufactured by Nippon Soda, Co., Ltd.

It is preferred that the above-described polybutadiene (meth)acrylate compound used in the present embodiment is a butadiene represented by the above formula 5 or formula 6, in which 85% by mass or more of all the butadiene units forming the polymer chain have a 1,2-vinyl bond (a 1,2-structure), and in which n in the formula is 7 to 77, and the average molecular weight is about 1,200 to 5,000.

The content of the above 1,2-vinyl bond butadienes is a value determined by a Fourier transform infrared spectrophotometer (liquid cell method). Specifically, the content refers to a value measured based on the method described below.

The above-described average molecular weight is a value determined by gel permeation chromatography (GPC). Specifically, the average molecular weight refers to a value measured based on the molecular weight measurement method described below.

The above-described polybutadiene (meth)acrylate compounds can be used singly or as a mixture of two or more.

From the perspective of thermal cycling properties, it is preferred to use a hydrogenated polybutadiene (meth)acrylate compound as the above-described polybutadiene (meth)acrylate compound.

(Method for Measuring the Content of 1,2-Vinyl Bond Butadiene)

The above-described content is a value determined by a Fourier transform infrared spectrophotometer (liquid cell method). Specifically, this content refers to a value measured based on the following method. Namely, the content is measured by measuring the infrared absorption spectrum using an "FTIR-8400" manufactured by Shimadzu Corporation as a measurement apparatus, and quantifying by measuring the degree of absorption around 910 cm$^{-1}$ (1,2-vinyl) and around 970 cm$^{-1}$ (1,4-trans).

(Molecular Weight Measurement Method)

The above-described average molecular weight is a value determined by gel permeation chromatography (GPC). Specifically, the average molecular weight refers to a value measured based on the following method.

Namely, detection was carried out using a "GPC" manufactured by Waters Corporation as a GPC apparatus, "KF-803", "KF-802", and "KF-801" manufactured by Showa Denko K.K. as columns, a THF (tetrahydrofuran) solution as an eluent, and a "UV245 nm RI" manufactured by Waters Corporation as a detector. Further, using a polystyrene standard sample as a standard molecular weight substance, a calibration curve was plotted based on the measured results, and the average molecular weight was determined based on this calibration curve.

Note that the average molecular weight is the value of the weight average molecular weight (Mw).

In the flux according to the present embodiment, it is preferred that the concentration of the above-described polybutadiene (meth)acrylate compound is about 3% by mass or more and 40% by mass or less, preferably about 5% by mass or more and 25% by mass or less, and more preferably about 16% by mass or more and 23% by mass or less.

If the concentration is in the above range, solder spreadability and solder wettability are good, while the occurrence of cracks in the flux residue is also suppressed. Further, if the concentration is in the above range, since an appropriate level of fluidity can be imparted when the flux is blended in the solder composition, the occurrence of dewetting can be suppressed.

The hydrogenated dimer acid according to the present embodiment is at least one dimer acid selected from the group consisting of dimer acids represented by the following formula 7 and dimer acids represented by the following formula 8.

[Formula 7]

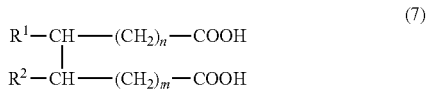

(7)

wherein $R^1$ and $R^2$ represent the same or different alkyl groups, and the total number of carbon atoms in the formula is 36.

[Formula 8]

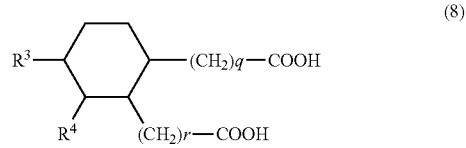

(8)

wherein $R^3$ and $R^4$ represent the same or different alkyl groups, and the total number of carbon atoms in the formula is 36.

The above-described dimer acid is a hydrogenated dimer acid in which the unsaturated double bonds of a dimer of an unsaturated fatty acid have been hydrogenated. Among such dimer acids, a dimer acid obtained by dimerizing an unsaturated fatty acid having 18 carbon atoms, that is hydrogenated, and that has a total of 36 carbon atoms, is preferred.

Among the hydrogenated dimer acids used in the present embodiment, a dimer acid represented by the above formula 7, wherein $R^1$ and $R^2$ both represent a nonyl group, and n=7 and m=7, is preferred.

Examples of a hydrogenated dimer acid represented by the above formula 7 include trade name "EMPOL1008" manufactured by BASF Corporation.

Among the hydrogenated dimer acids used in the present embodiment, a dimer acid represented by the above formula 8 wherein $R^3$ and $R^4$ both represent a hexyl group, and q=7 and r=8, is preferred.

Examples of a hydrogenated dimer acid represented by the above formula 8 include trade name "PRIPOL1010" manufactured by Croda Europe Limited.

In the flux according to the present embodiment, the above-described dimer acids can be used singly or as a mixture of two or more.

In the present embodiment, it is preferred that the concentration of the above-described dimer acid is about 3% by mass or more and 30% by mass or less, preferably about 5% by mass or more and 25% by mass or less, and more preferably about 9% by mass or more and 16% by mass or less.

If the concentration is in the above range, flux residue stickiness can be suppressed, contamination due to dust or the like can be prevented, and the occurrence of dewetting can be suppressed.

Although the flux according to the present embodiment includes the above-described polybutadiene (meth)acrylate compound as a resin component and the above-described dimer acid, the flux may further include another synthetic resin or a rosin resin as a resin component.

Especially, from the perspective of solderability, it is preferred that at least one rosin resin selected from the group consisting of rosin, and hydrogenated rosin, polymerized rosin, disproportionated rosin, and acrylic acid-modified rosin, which are derivatives of the above-mentioned rosin, is further included as a resin component.

Among the above-described rosin resins, from the perspective of thermal cycling properties, hydrogenated rosin is preferred.

In the present embodiment, from the perspective of reducing the occurrence of solder balls, it is preferred that the concentration of the rosin resin is about 5% by mass or more and 40% by mass or less, preferably about 20% by mass or more and 35% by mass or less, and more preferably about 25% by mass or more and 30% by mass or less.

In addition to the above-described resin components, components that are normally included in a flux, such as an activator, a solvent, and a thixotropic agent, may also be blended in the flux according to the present embodiment.

Examples that can be used as the above-described activator include an amine-hydrohalic acid salt and an organic acid. Examples of the amine-hydrohalic acid salt include diethylamine hydrobromide and cyclohexylamine hydrobromide.

Examples of the organic acid include glutaric acid, adipic acid, azelaic acid, sebacic acid, stearic acid, and benzoic acid.

The above-described activators can be used singly or as a mixture of two or more.

Among the above-described activators, from the perspective of the viscosity stability of the solder paste, it is preferred to use an organic acid such as glutaric acid, adipic acid, azelaic acid, and sebacic acid.

In the flux according to the present embodiment, it is preferred that the concentration of the above-described activator is about 1% by mass or more and 10% by mass or less, and preferably about 2% by mass or more and 6% by mass or less.

It is preferred that the concentration is in the above range as this enables solder wettability and electrical insulating properties to be maintained in an appropriate range.

Examples of the above-described solvent include glycol ethers such as diethylene glycol monohexyl ether (hexyl diglycol), diethylene glycol dibutyl ether (dibutyl diglycol), diethylene-glycol mono-2-ethylhexyl ether (2-ethylhexyl diglycol), and diethylene-glycol monobutyl ether (butyl diglycol); aliphatic compounds such as n-hexane, isohexane and n-heptane; esters such as isopropyl acetate, methyl propionate, and ethyl propionate; ketones such as methyl ethyl ketone, methyl-n-propyl ketone, and diethyl ketone; and alcohols such as ethanol, n-propanol, isopropanol, and isobutanol.

The above-described solvents can be used singly or as a mixture of two or more.

When using the flux as a flux for a solder paste, among the above-described solvents, from the perspective of ensuring optimum continuous printability, it is preferred to use the above-described glycol ether that has a boiling point in the range of 200° C. or more and 300° C. or less, such as diethylene glycol monohexyl ether, diethylene glycol monobutyl ether, and diethylene glycol dibutyl ether.

In the flux according to the present embodiment, it is preferred that the concentration of the above-described solvent is about 20% by mass or more and 50% by mass or less, and preferably about 25% by mass or more and 40% by mass or less.

It is preferred that the concentration is in the above range as this enables the resin component to be sufficiently dissolved and an appropriate level of viscosity to be imparted to the flux.

Examples of the thixotropic agent include hydrogenated castor oil, beeswax, carnauba wax, and higher fatty acid amides such as stearic acid amide.

The above-described thixotropic agents can be used singly or as a mixture of two or more.

Among the above-described thixotropic agent, it is preferred to use hydrogenated castor oil, a higher fatty acid amide, or the like, as this enables the solder paste to have good thixotropic properties during printing.

Further, although the flux according to the present embodiment can be used as a component of a solder composition such as a solder paste by mixing with a solder alloy powder as described below, the flux can also be used as a resin flux cored solder material obtained by filling the above-described flux inside a wire-shaped member of a solder alloy. Alternatively, the above-described flux can be used as a flux during soldiering by a flow soldering method.

Next, a solder composition that uses the flux according to the present embodiment like that described above will be described.

The solder composition according to the present embodiment includes the above-described flux and a solder alloy powder.

Although a known solder alloy powder can be used as the above-described solder alloy powder, among such solder alloy powders, it is preferred to use a powder of a lead-free solder alloy, such as a Sn—Ag solder, a Sn—Ag—Cu solder, a Sn—Ag—Cu—Bi solder, a Sn—Ag—In—Bi solder, a Sn—Cu solder, a Sn—Zn solder, and a Sn—Bi solder, which are used as lead-free solders.

Further, the term lead-free solder in the present embodiment refers to a lead-free solder as defined in JIS Z 3282.

It is preferred that the solder composition according to the present embodiment is a solder paste obtained by mixing 80% by mass or more and 92% by mass or less, and preferably 85% by mass or more and 90% by mass or less, of the above-described solder alloy powder in 8% by mass or more and 20% by mass or less, and preferably 10% by mass and 15% by mass or less, of the above-described flux, and forming a paste from the resultant mixture.

For a solder composition that uses the above-described lead-free solder alloy, when an electronic component is mounted by a reflow method, it is necessary to perform reheating at around 200° C., which is a higher temperature than for a conventional lead-containing solder composition, such as Sn—Pb. Further, when a lead-free solder composition is used, since it is harder to obtain solder wettability than for a lead-containing solder composition, the above-described preheating is carried out under an ultra-low oxygen atmosphere having an oxygen concentration of 500 ppm or less by filling with nitrogen gas.

In addition, solder wettability is ensured by using a substrate for lead-free solder that is obtained, for example, by treating the substrate with a special treatment.

Namely, lead-free solder generally suffers from the the following problem: costs are higher and more time and effort are required than when using a lead-containing solder composition.

On the other hand, the solder composition according to the present embodiment has good solder wettability even if a lead-free solder alloy powder is used as the solder alloy powder. For example, solder wettability can be maintained even if high-temperature preheating is carried out under an air atmosphere.

Further, a highly reliable mounted substrate can be obtained that is not susceptible to cracks forming in the flux residue after soldering.

Next, a method for manufacturing an electronic circuit mounted substrate by mounting an electronic component on an electronic circuit substrate using the solder composition according to the present embodiment will be described.

The method for manufacturing an electronic circuit mounted substrate according to the present embodiment includes: forming a solder printing pattern by printing a solder composition; mounting an electronic component on the solder printing pattern; and preheating an electronic circuit substrate on which the electronic component is mounted in an air atmosphere at 150° C. or more and 200° C. or less, and then performing reflow for main heating.

First, a solder printing pattern is formed by printing a solder composition including the above-described lead-free solder alloy powder according to the present embodiment on a conductor portion of the surface of a printed circuit substrate as an electronic circuit substrate.

Examples of the above-described conductor portion include the portions on which an electronic component is to be mounted, such as a copper foil portion and a through-hole aperture portion that are not coated with an insulating layer, such as a solder resist, and are exposed to the surface of the above-described printed circuit substrate.

Although a known solder printing method can be employed to form the solder printing pattern on the above-described conductor portion, for example, a method that prints the solder composition on the above-described conductor portion with a squeegee or the like using a mask in which apertures are formed that expose the above-described conductor portion, may also be employed.

Further, the solder printing method according to the present embodiment may also be automatically carried out using a known solder printing apparatus.

The electronic component to be mounted is mounted on the above-described solder printing pattern.

It is preferred that the above-described electronic component is temporarily fixed on the above-described printed circuit substrate using an adhesive or the like as necessary. Further, the component mounting method according to the present embodiment may also be automatically carried out using a known component mounting apparatus, for example.

In addition, after preheating the printed circuit substrate on which the electronic component is mounted in an air atmosphere at 150° C. or more and 200° C. or less, reflow for main heating is carried out.

In this case, the above-described preheating may be carried out for 60 seconds or more and 180 seconds or less.

The following specific reflow conditions are preferred as the reflow conditions.

First, as the temperature profile, for the preheating, heating is carried out in an air atmosphere at a temperature of 150° C. or more and 200° C. or less, for 60 seconds or more and 180 seconds or less.

In addition, for the main heating, heating is subsequently carried out in an air atmosphere at a peak temperature of 180° C. or more and 250° C. or less, for 20 seconds or more and 60 seconds or less.

The electronic circuit mounted substrate is then manufactured by leaving the substrate to cool naturally or cooling the substrate using a cooling apparatus such as a cooler, and mounting the electronic component thereon.

The electronic circuit mounted substrate manufactured by the manufacturing method according to the present embodiment can sufficiently exhibit solder wettability and prevent defects such as dewetting from occurring easily even if reflow soldering is performed under high-temperature preheating conditions in an air atmosphere as described above.

Further, the flux residue present on the electronic circuit mounted substrate after reflow has good cracking resistance. Especially, cracks do not occur easily and the reliability of the substrate can be maintained even if the electronic circuit mounted substrate is used under conditions in which the temperature change during a thermal cycle and the like is severe.

Therefore, the electronic circuit mounted substrate manufactured by the manufacturing method according to the present embodiment can be optimally used as an electronic circuit mounted substrate for the engine of an automobile, for example.

With the flux according to the present invention, cracks are less likely to form in the flux residue after soldering, and good solder wettability can be exhibited even if reflow heating is carried out under high-temperature preheating conditions.

In addition, good solder wettability can be exhibited even if reflow heating is carried out under the above-described high-temperature preheating conditions in an air atmosphere.

By including the above-described polybutadiene (meth) acrylate compound and the above-described dimer acid along with at least one rosin resin selected from the group consisting of rosin, hydrogenated rosin, polymerized rosin, disproportionated rosin, and acrylic acid-modified rosin, the flux according to the present invention can obtain good solder wettability even if reflow is carried out by high-temperature preheating, while also suppressing the occurrence of cracks.

The solder composition according to the present invention can exhibit sufficient solder wettability even if reflow heating is carried out in an air atmosphere at a temperature at which a lead-free solder alloy melts.

According to the method for manufacturing an electronic circuit mounted substrate according to the present invention, which includes: forming a solder printing pattern on a conductor portion that is exposed to the surface of the electronic circuit substrate by printing the above-described solder composition according to the present invention; mounting an electronic component on the solder printing pattern; and after preheating in an air atmosphere at 150° C. or more and 200° C. or less, performing reflow for main heating, it is possible to provide good solderability, and enables an electronic circuit mounted substrate to be manufactured in which cracks in the flux residue portion do not easily occur, even if performing reflow heating without using nitrogen gas or the like.

Thus, according to the present invention, a flux that is capable of suppressing the cracks in the flux residue, and that has good solder wettability even under high-temperature soldering, a solder composition, and a method for manufacturing an electronic circuit mounted substrate, can be provided.

Although the flux for a solder composition, the solder composition, and the method for manufacturing an electronic circuit mounted substrate according to the present embodiment are as described above, it should be considered that the embodiments disclosed above are examples in every respect, and are not limiting. The scope of the present invention is disclosed not by the above-described description, but by the scope of claims, and it is intended that equivalent meanings to the scope of claims and any changes within that scope are also included.

Examples

Next, Examples of the present invention will be described in conjunction with Comparative Examples. However, the present invention should not be construed as being limited to the following Examples.
(Flux Production)
The following materials were charged into a suitable beaker in the blend shown in Table 1, and stirred and mixed with a glass rod to produce a flux.
The production temperature was appropriately adjusted to a temperature at which the rosin, thixotropic agent, activator, and the like could dissolve in a solvent, for example, to 100° C. to 200° C. Although the dissolving time depends on the production temperature and the amount of flux production, it is preferred to appropriately adjust the time to from about 30 minutes to 3 hours, for example.
<<Materials>>
Hydrogenated rosin: Trade name "HYPALE CH," manufactured by Arakawa Chemical Industries, Ltd.
1,2-Vinyl polybutadiene acrylate: Trade name "NISSO-PB TEA-1000" (85% or more of 1,2-vinyl, remainder of the bonds: 1,4-trans (average molecular weight of 2,050), manufactured by Nippon Soda, CO., Ltd.
Hydrogenated 1,2-vinyl polybutadiene acrylate: Trade name "NISSO-PB TEAI-1000" (85% or more of 1,2-vinyl, remainder of the bonds: 1,4-trans (average molecular weight: 2,250), manufactured by Nippon Soda, CO., Ltd.
Hydrogenated liquid dimer acid (1): Trade name "EMPOL1008" manufactured by BASF Corporation.
Hydrogenated liquid dimer acid (2): Trade name "PRIPOL1010" manufactured by Croda Europe Limited.
C21 liquid dimer acid: C21 dibasic fatty acid (non-hydrogenated product), Trade name "DIACID-1550," manufactured by Harima Chemicals Inc.
1,2-Vinyl polybutadiene (liquid): Trade name "NISSO-PB GI-1000" (85% or more of 1,2-vinyl, remainder of the bonds: 1,4-trans, average molecular weight: 1,250), manufactured by Nippon Soda, Co., Ltd.
Acrylic resin (1): Non-functional group type liquid acrylic polymer, Trade name "ARUFON UP-1170" (glass transition temperature: −57° C., molecular weight: 8,000), manufactured by Toagosei, Co., Ltd.
Acrylic resin (2): Non-functional group type liquid acrylic polymer, Trade name "ARUFON UP-1080" (glass transition temperature: −61° C., molecular weight: 6,000), manufactured by Toagosei, CO., Ltd.
Polyamide resin (1): Reaction product of a straight-chain diamine and a polymerized fatty acid, Trade name "MACROMELT OM-673" (glass transition temperature: −45° C., softening point: 185° C.), manufactured by Henkel Japan Ltd.
Polyamide resin (2): Reaction product of a straight-chain diamine and a polymerized fatty acid, Trade name "MACROMELT OM-652" (glass transition temperature: −38° C., softening point: 155° C.), manufactured by Henkel Japan Ltd.
Ethylene vinyl acetate copolymer: Trade name "EVAFLEX EV205W," vinyl acetate content: 28% (glass transition temperature: −28° C., melt flow rate: 800 g/10 min), manufactured by Dupont-Mitsui Polychemicals Co., Ltd.
Glutaric acid
Diethylamine hydrobromide
Hydrogenated castor oil
Diethylene glycol monohexyl ether
(Solder Paste Production)
The solder pastes were produced as the solder compositions of Examples 1 to 4 and Comparative Examples 1 to 10 by mixing and stirring 11% by mass of each of the fluxes adjusted as shown in Table 1 and 89% by mass of the lead-free solder alloy powder (Sn:Ag:Cu=96.5:3.0:0.5 (% by mass)).
Using the solder pastes of the above-described respective Examples and Comparative Examples, the following tests were carried out using a reflow soldering apparatus (trade name: APSR-257, manufactured by Koki Tec Corp).
The reflow conditions are as follows.
<<Reflow Conditions>>
Preheating: Air atmosphere, 200° C., 120 seconds
Main Heating: Air atmosphere, peak temperature of 230° C., 220° C. or more, heating time of 50 seconds
(Solderability Test)
As the test substrate, a substrate was prepared by forming a 22 μm-thick insulating layer formed from a solder resist having a circular aperture portion 6 mm in diameter on a glass epoxy base material laminated with 18 μm-thick copper foil, and coating a preflux (trade name: GLICOAT-SMD (F2), manufactured by Shikoku Chemicals Corporation) for protecting the copper foil.
The solder paste of each of the above-described respective Examples and Comparative Examples was then printed to a thickness of 180 μm (metal mask thickness) on the copper foil exposed from the aperture portion of the above-described test substrate surface.
The substrates on which the solder paste had been printed were then heated under the above-described reflow conditions, and the presence of dewetting was checked.
The checking method was carried out by visually observing six random solder sections on each substrate. Substrates whose base layer copper foil was completely wet with solder, and that showed no signs at all of repellence or the like were evaluated as "no dewetting," and substrates for which even a little repellence was confirmed were evaluated as "dewetting present." Substrates that had no dewetting at all were marked as "good," and substrates that had dewetting at even one location were marked as "poor."
(Thermal Cycling Test)
A test substrate was prepared by forming QFP (Quad Flat Package) patterns having a pitch of 0.5 mm in the test substrate used in the above-described solderability test instead of the above-described circular aperture portion. The solder paste of each of the above-described respective Examples and Comparative Examples was printed to a thickness of 180 μm (metal mask thickness) on the above-described pattern of this substrate.
The substrates were subjected to reflow in the same manner as in the above-described solderability test, and then placed in a thermal cycle environment for 1,000 cycles, in which one cycle consisted of −40° C. for 30 minutes and 125° C. for 30 minutes, using a gas phase thermal shock testing apparatus (TS-100, manufactured by Kusumoto Chemicals, Ltd). The presence of cracks in the substrates thereafter was checked.

The checking method was carried out by observing the flux residue at 20 random locations on each substrate with a stereomicroscope capable of enlarging to 40-times magnification. Substrates having no cracks at all in any of the flux residues were evaluated as "good," substrates having tiny cracks in some of the flux residues, but no cracks that were continuous between the QFP patterns and thus could be used were also evaluated as "good," and substrates having at even one location a crack that was completely formed from the top to the bottom of the flux residue, passing through to the base layer, were evaluated as "poor."

(Voltage Application Test)

The comb-type electrode substrate described in JIS Z 3197 (1999) 8.5.3(b) 5) (FIG. 9. Test Substrate) was prepared as a test substrate.

The solder paste of each of the above-described respective Examples and Comparative Examples was printed to a thickness of 100 μm (metal mask thickness) on the pattern of the above-described substrate.

The substrates were subjected to reflow in the same manner as in the above-described solderability test, and then subjected to a voltage application test based on the insulation resistance test stipulated in JIS Z 3197 (1999) 8.5.3.

The voltage application test was carried out by humidifying and degrading at an applied voltage of 16 V for 1,000 hours under test conditions of a temperature of 85° C. and a relative humidity of 85%.

Substrates that constantly maintained a resistance value to the power of 9Ω or greater from the initial application until 1,000 hours had elapsed were evaluated as "good," while substrates that exhibited a resistance value to the power of less than 9Ω even once during the test were evaluated as "poor."

(Stickiness Test)

A copper plate (50×25, thickness: 0.5 μm) was prepared as a test piece.

The solder paste of each of the above-described respective Examples and Comparative Examples was applied to a thickness of 200 μm (metal mask thickness) in a size with a diameter of 6.5 mm on one face of the above-described test piece.

The above-described test piece was subjected to reflow under the same conditions as those in the above-described solderability test, then cooled to ordinary temperature. Based on the pressure-sensitive adhesion test of solder paste residue after reflow stipulated in JIS Z 3284 (1994), Appendix 12, powdered talc was scattered over the test piece, then wiped away once with a soft-hair brush. Stickiness was evaluated by visually observing how much of the above-described powdered talc was removed.

Substrates for which the powdered talc was easily removed by wiping with the brush were evaluated as "good," and substrates for which the powdered talc either could not be removed or was difficult to remove were evaluated as "poor."

(Solder Ball Test)

A substrate was produced by, with the test substrate used in the above-described thermal cycling test, printing the solder paste of each of the above-described respective Examples and Comparative Examples to a thickness of 180 μm on the copper foil portion of an electrode on which 6330 chips and 2012 chips could be mounted instead of the above-described circular aperture portion, and pressing seven 6330 chips and twenty 2012 chips to the substrate face on the electrode on which the solder paste was printed, and mounting these chips thereon. The substrate mounted with these chips was heated under the above-described reflow conditions, and then the occurrence of side balls produced on each side of the 6330 chips and the 2012 chips was checked with a stereomicroscope capable of enlarging to 15-times magnification.

Substrates for which the number of side balls produced in the whole of each chip was less than 5 per substrate were evaluated as "good," and substrates for which the number of side balls that were produced exceeded this were evaluated as "poor."

The above respective test results are shown in Table 1.

TABLE 1

| | | | Example | | | | Comparative Example | | | | | | | | | | |
|---|---|---|---|---|---|---|---|---|---|---|---|---|---|---|---|---|---|
| | | | 1 | 2 | 3 | 4 | 1 | 2 | 3 | 4 | 5 | 6 | 7 | 8 | 9 | 10 |
| Flux Component (% by mass) | Resin | Hydrogenated Rosin | 30 | 30 | 25 | 30 | 30 | 30 | 30 | 30 | 30 | 30 | 30 | 30 | 28 | 30 |
| | | 1,2-Vinyl Polybutadiene Acrylate | 17 | 17 | | | | | | | | | | | 22 | |
| | | Hydrogenated 1,2-Vinyl Polybutadiene Acrylate | | | 25 | 18 | | | | | | | | | | 18 |
| | | Hydrogenated Liquid Dimer Acid(1) | 15 | | 10 | | 11 | 11 | | | 11 | 11 | | | | |
| | | Hydrogenated Liquid Dimer Acid(2) | | 15 | | 10 | | | 11 | 11 | | | 11 | 11 | | |
| | | C21 Liquid Dimer Acid (non-hydrogenated product) | | | | | | | | | | | | | 10 | 10 |
| | | 1,2-Vinyl Polybutadiene | | | | | | | | | | 20 | | | | |
| | | Acrylic Resin(1) | | | | | 20 | | 20 | | | | | | | |
| | | Acrylic Resin(2) | | | | | | 20 | | | | | | | | |
| | | Polyamide Resin(1) | | | | | | | | | 20 | | | | | |
| | | Polyamide Resin(2) | | | | | | | | | | | 20 | 20 | | |
| | | Ethylene Vinyl Acetate Copolymer | | | | | | | | | | | | | 20 | |
| | Activator | Glutaric Acid | 2 | 2 | 2 | 2 | 2 | 2 | 2 | 2 | 2 | 2 | 2 | 2 | 2 | 2 |
| | | Diethylamine Hydrobromide | 1 | 1 | 1 | 1 | 1 | 1 | 1 | 1 | 1 | 1 | 1 | 1 | 1 | 1 |

TABLE 1-continued

| | | Example | | | | Comparative Example | | | | | | | | | |
|---|---|---|---|---|---|---|---|---|---|---|---|---|---|---|---|
| | | 1 | 2 | 3 | 4 | 1 | 2 | 3 | 4 | 5 | 6 | 7 | 8 | 9 | 10 |
| Thixotropic Agent | Hydrogenated castor oil | 6 | 6 | 6 | 6 | 6 | 6 | 6 | 6 | 6 | 6 | 6 | 6 | 6 | 6 |
| Solvent | Diethylene Glycol Monohexyl Ether | 29 | 29 | 31 | 33 | 30 | 30 | 30 | 30 | 30 | 30 | 30 | 30 | 31 | 33 |
| Flux Content (% by mass) | | | | 11 | | | | | | | 11 | | | | | |
| Solder Powder Content (% by mass) | | | | 89 | | | | | | | 89 | | | | | |
| Evaluation Results | Solderability (dewetting) | Good | Good | Good | Good | Poor | Poor | Poor | Poor | Poor | Poor | Poor | Poor | Poor | Poor |
| | Thermal cycling test | Good | Good | Good | Good | Good | Good | Good | Good | Good | Good | Good | Good | Poor | Poor |
| | Solder Ball Test | Good | Good | Good | Good | Poor | Poor | Poor | Poor | Good | Good | Good | Poor | Good | Good |
| Voltage Application Test | Initial | Good | Good | Good | Good | Good | Good | Good | Good | Good | Good | Good | Good | Good | Good |
| | After 24 Hours | Good | Good | Good | Good | Good | Good | Good | Good | Poor | Poor | Poor | Good | Good | Good |
| | After 1,000 Hours | Good | Good | Good | Good | Good | Good | Good | Good | Poor | Poor | Poor | Good | Good | Good |
| Residue Flux Stickiness | | Good | Good | Good | Good | Poor | Poor | Poor | Good | Good | Good | Good | Good | Good | Good |

As shown in Table 1, each of the Examples exhibited good solderability (dewetting properties), while the Comparative Examples were all poor.

In Comparative Examples 9 and 10, which used a non-hydrogenated dimer acid, cracks occurred in the thermal cycling test.

Further, in Comparative Examples 5 to 7, which used a polyamide resin as a resin component, the insulating properties were not good. This is thought to be due to the resin component in the solder composition causing moisture absorption and degradation, causing insulation to deteriorate.

In addition, in Comparative Examples 1 to 3 that used an acrylic resin as a resin component, the flux residue was sticky.

The occurrence of solder balls in Comparative Examples 1 to 4 and Comparative Example 8 was substantial.

The invention claimed is:

1. A flux comprising at least one polybutadiene (meth)acrylate compound selected from a group consisting of polybutadiene (meth)acrylate compounds represented by a following formula 1 and polybutadiene (meth)acrylate compounds represented by a following formula 2:

[Formula 1]

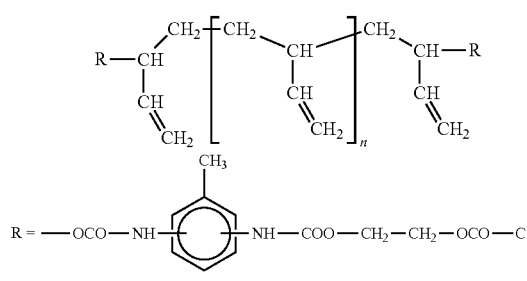

(1)

$(R') = CH_2$
$R' = $—H, or —$CH_3$

[Formula 2]

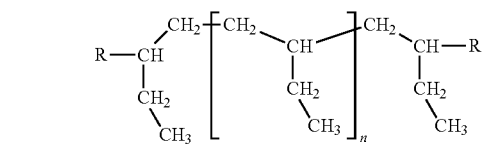

(2)

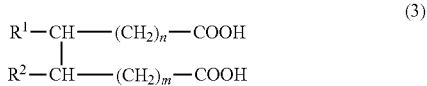

$(R') = CH_2$
$R' = $—H, or —$CH_3$;

and a hydrogenated dimer acid.

2. The flux according to claim 1, wherein the dimer acid is at least one dimer acid selected from a group consisting of dimer acids represented by a following formula 3 and dimer acids represented by a following formula 4:

[Formula 3]

$$R^1-CH-(CH_2)_n-COOH \atop R^2-CH-(CH_2)_m-COOH \qquad (3)$$

wherein $R^1$ and $R^2$ represent the same or different alkyl groups, and the total number of carbon atoms in the formula is 36;

[Formula 4]

(4)

$R^3$—⬡—$(CH_2)_q$—COOH
$R^4$   $(CH_2)_r$—COOH wherein $R^3$ and $R^4$ represent the same or different alkyl groups, and the total number of carbon atoms in the formula is 36.

3. The flux according to claim 1, further comprising at least one rosin resin selected from a group consisting of rosin, hydrogenated rosin, polymerized rosin, disproportionated rosin, and acrylic acid-modified rosin.

4. A solder composition comprising a flux according to claim 1.

5. The solder composition according to claim 4, comprising a lead-free solder alloy.

6. A method for manufacturing an electronic circuit mounted substrate comprising:

forming a solder printing pattern by printing a solder composition comprising a flux according to claim 1 on a conductor portion on a surface of an electronic circuit substrate;

mounting an electronic component on the solder printing pattern; and preheating the electronic circuit substrate on which the electronic component is mounted in an air atmosphere at 150° C. or more and 200° C. or less, and then performing reflow for main heating.

7. The method for manufacturing an electronic circuit mounted substrate according to claim 6, wherein the preheating is carried out for 60 seconds or more and 180 seconds or less.

8. The flux according to claim 2, further comprising at least one rosin resin selected from a group consisting of rosin, hydrogenated rosin, polymerized rosin, disproportionated rosin, and acrylic acid-modified rosin.

9. A solder composition comprising a flux according to claim claim 2.

10. A solder composition comprising a flux according to claim 3.

11. A solder composition comprising a flux according to claim 8.

12. The solder composition according to claim 9, comprising a lead-free solder alloy.

13. The solder composition according to claim 10, comprising a lead-free solder alloy.

14. The solder composition according to claim 11, comprising a lead-free solder alloy.

* * * * *